United States Patent
Liu et al.

(10) Patent No.: US 9,908,988 B2
(45) Date of Patent: Mar. 6, 2018

(54) CURED THERMOSET FOR HIGH THERMAL CONDUCTIVE MATERIALS

(71) Applicants: Dow Global Technologies LLC, Midland, MI (US); Rohm and Haas Company, Philadelphia, PA (US)

(72) Inventors: Wei Liu, Shanghai (CN); Xiaomei Song, Shanghai (CN); Hongyu Chen, Zhangjiang (CN); Yan Huang, Shanghai (CN); Yu Zhang, Shanghai (CN)

(73) Assignees: Dow Global Technologies LLC, Midland, MI (US); Rohm and Haas Company, Philadelphia, PA (US)

( * ) Notice: Subject to any disclaimer, the term of this patent is extended or adjusted under 35 U.S.C. 154(b) by 103 days.

(21) Appl. No.: 15/108,794

(22) PCT Filed: Dec. 30, 2013

(86) PCT No.: PCT/CN2013/090956
§ 371 (c)(1),
(2) Date: Jun. 29, 2016

(87) PCT Pub. No.: WO2015/100555
PCT Pub. Date: Jul. 9, 2015

(65) Prior Publication Data
US 2016/0326339 A1    Nov. 10, 2016

(51) Int. Cl.
- *C08K 3/28* (2006.01)
- *C08L 63/00* (2006.01)
- *H01L 33/64* (2010.01)
- *H01L 23/373* (2006.01)
- *C08K 3/22* (2006.01)
- *C08K 5/435* (2006.01)
- *C08G 59/24* (2006.01)
- *C08G 59/50* (2006.01)

(52) U.S. Cl.
CPC ............. *C08K 3/28* (2013.01); *C08G 59/245* (2013.01); *C08G 59/5033* (2013.01); *C08K 3/22* (2013.01); *C08K 5/435* (2013.01); *C08L 63/00* (2013.01); *H01L 23/3737* (2013.01); *H01L 33/641* (2013.01); *C08K 2003/2227* (2013.01); *C08K 2201/001* (2013.01); *C08K 2201/005* (2013.01); *H01L 2924/0002* (2013.01); *H01L 2933/0033* (2013.01); *H01L 2933/0075* (2013.01)

(58) Field of Classification Search
CPC . C08K 3/28; C08K 5/435; C08K 3/22; C08K 2003/2227; C08K 2201/001; C08K 2201/005; C08G 59/5033; C08G 59/245; H01L 23/3737; H01L 33/641; H01L 2933/0033; H01L 2933/0075; C08L 63/00
See application file for complete search history.

(56) References Cited

U.S. PATENT DOCUMENTS

| | | | |
|---|---|---|---|
| 5,463,091 A | 10/1995 | Earls et al. | |
| 5,510,431 A * | 4/1996 | Earls | C08G 59/18 |
| | | | 525/481 |
| 5,811,504 A | 9/1998 | Shiota et al. | |
| 5,900,447 A | 5/1999 | Ishida | |
| 2014/0283972 A1 | 9/2014 | Nishiyama et al. | |

FOREIGN PATENT DOCUMENTS

JP     2010163540 A     7/2010

OTHER PUBLICATIONS

Journal of Polymer science: Part A Polymer Chemistry, 1994, vol. 32, 1121-1129.
Takashim1hara, Yasuhiro Nishimiya, Naoyuki Koide. Synthesis and Thermal Properties of Combined Liquid Crystalline Epoxy Resins, Journal of Applied Polymer Science, Dec. 30, 1998(Dec. 30, 1998) 68, p. 979-1990.

* cited by examiner

*Primary Examiner* — Kyoung Lee
(74) *Attorney, Agent, or Firm* — S. Matthew Cairns

(57) ABSTRACT

An article having a heat source and an electrically insulating thermal management component located in proximity to the heart source. The thermal management component contains a cured thermoset formed from a composition containing (a) a diglycidyl compound which has mesogenic structure and melting point of the diglycidyl compound is 150° C. or less, (b) a hardener and (c) an inorganic filler having specific thermal conductivity. The cured thermoset has high thermal conductivity.

11 Claims, No Drawings

US 9,908,988 B2

CURED THERMOSET FOR HIGH THERMAL CONDUCTIVE MATERIALS

FIELD OF THE INVENTION

The present invention relates to a cured thermoset with high thermal conductivity suitable for a thermal management element of electronic devices and to devices containing such materials. More particularly, a cured thermoset formed from a composition comprising a specific diglycidyl compound having mesogenic structure so that the cured thermoset shows liquid crystalline properties.

BACKGROUND OF THE INVENTION

Thermal management is critical in every aspect of the microelectronics space, such as integrated circuits (IC), light-emitting diode (LED), power electronics, displays and photovoltaics. The performance of p-n junctions (the basis of these devices) is directly affected by operating temperature. Lowering the operating temperature of these devices increases lifetime and improves performance, as compared to operation at higher temperatures.

In solid state lighting business, there is strong need to improve heat management. Proper dissipation of heat in LED devices is critical to their reliable long-term operation. Failure to adequately manage the heat can have an undesirable impact on the performance of LEDs. Prolonged exposure to excessive operating temperatures can lead to irreversible damage to the semiconductor components within the LED die, resulting in lowered light outputs, changes to the color rendering index, and significantly reduced LED lifetimes. Therefore, a material with higher heat conductive property is desired for heat management of LED devices.

A heat sink in an electronic system is a passive component that cools a device by dissipating heat into the surrounding air. Heat sinks are used to cool electronic components or semiconductor components such as high-power semiconductor devices, and optoelectronic devices such as higher-power lasers and light emitting diodes (LEDs). Traditional heat sink uses aluminum fins and several copper heat pipes for cooling of high-heat-dissipation processors. A heat sink is designed to increase the surface area in contact with the cooling medium surrounding it, such as the air. However, the metals are heavy and difficult to process a complex form. Therefore, it has been required to develop a material with higher thermal conductive as well as less weight and lower processing cost as alternative to metal.

Although polymer materials are light and easy to processing, those low thermal conductive property is a barrier of application to a heat sink. However, it is known polymers with ordered structure have higher thermal conductivity. Therefore, crystalline polymers or liquid crystalline polymers are studied as an alternative of metal used for a heat sink.

Some liquid crystalline thermosetting resins have been studied materials which have high heat conductive properties, see e.g. JP2010163540, U.S. Pat. No. 5,811,504 and WO2011040416. However, those resins generally have insufficient thermal conductivity or are difficult to process or mold as an article.

Another solution to increase the thermal conductivity of a thermosetting resin is adding high amounts of thermal conductive materials within a thermosetting resin. Since ceramics such as boron nitride show high thermal conductivity, ceramic filler can be added within a thermosetting resin to increase thermal conductivity of a thermosetting resin, see e.g. US5900447. However, quite high amount of filler is needed for thermal conductive resin, it causes a difficulty for process because the high pressure is needed to mold such resin.

Accordingly, a cured thermoset with high thermal conductivity and easy processability suitable for a thermal management element of electronic devices is desired.

SUMMARY OF THE INVENTION

Inventors of this invention have now found that a cured thermoset formed from a composition comprising a specific diglycidyl compound having mesogenic structure, a hardener and an inorganic filler having specific thermal conductivity has both high thermal conductivity and easy processability suitable for a thermal management component of an article comprising IC, LED, power electronics, displays or photovoltaics. The specific diglycidyl compound has a mesogenic structure and a melting point of the compound is 150° C. or less.

Therefore, one aspect of the invention relates to an article comprising a heat source and an electrically insulating thermal management component located in proximity to the heat source, wherein the heat management component comprises a cured thermoset formed from a composition described above.

Another aspect of the invention relates to a cured thermoset with the thermal conductivity of 10 W/m·K or more, formed from a composition comprising described above.

Further aspect of the invention relates to a method for forming the cured thermoset of the above, wherein the cured temperature is from 80 to 180° C.

DETAILED DESCRIPTION OF THE INVENTION

As used throughout this specification, the abbreviations given below have the following meanings, unless the context clearly indicates otherwise: g=gram; mg=milligram; m=meter; mm=millimeter; cm=centimeter; min.=minute(s); s=second(s); hr.=hour(s); ° C.=degree(s) C.=degree(s) Centigrade; K=kelvin; W=watt; wt %=weight percent(s); vol %=volume percent(s). Throughout this specification, the word 'resin' and 'polymer' is used interchangeably.

<Composition>

The composition which forms a cured thermoset used in the invention comprises (a) a diglycidyl compound which has mesogenic structure, and a melting point of 150° C. or less, (b) a hardener and (c) an inorganic filler with a thermal conductivity of 100 W/m·K or more.

(a) Diglycidyl Compound

Diglycidyl compound used in the invention has mesogenic structure. 'Mesogen' means a fundamental unit of a liquid crystal that induces structural order in the crystals. Mesogens consist of a rigid and flat moieties which align the compounds in one direction. Typically, mesogens comprise two or more aromatic rings connected by divalent linkage having unsaturated bond so that those aromatic rings are fixed as one planer structure. Because of the interaction between pi-electrons of those aromatic rings, compounds having mesogenic structure are aligned in one direction and generate liquid crystalline property.

Examples of diglycidyl compounds used in the invention having mesogenic structure include the following chemical structures (1):

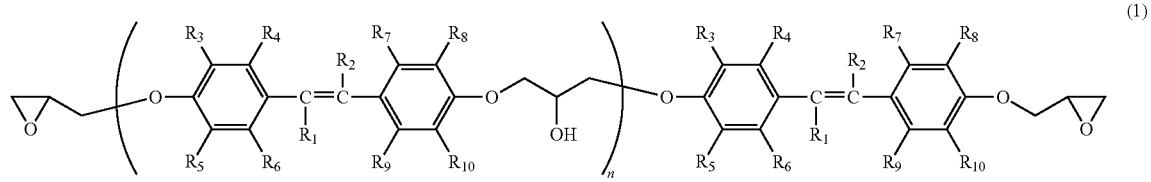

Wherein $R_1$ and $R_2$ are independently selected from hydrogen atom or an alkyl group having from 1 to 10 carbon atoms; $R_3$ to $R_{10}$ are independently selected from the group consisting of hydrogen atom, alkyl group having from 1 to 10 carbon atoms, trifluoromethyl group, aryl group, halogen atom preferably chlorine or bromine, nitro group, nitrile group and methoxy group. n is integer from 0 to 10.

The diglycidyl compound used in the invention has a melting point of 150° C. or less. If the melting point of the diglycidyl compound is more than 150° C., the gel time of the diglycidyl compound would be quite short and the processability of the compound would be poor. Preferably, the melting point of the diglycidyl compound is 140° C. or less.

Those diglycidyl compound can be synthesized by reacting a dihydroxyl compound having mesogenic structure with epihalohydrin disclosed U.S. Pat. No. 5,463,091.

Preferably, the diglycidyl compound used in the invention is shown in the following chemical formula (2):

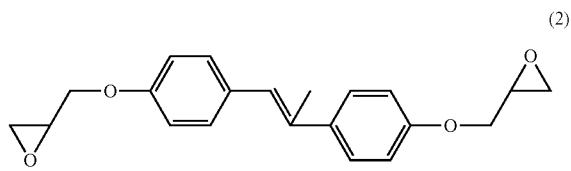 [SMILES: C/C(=C\c1ccc(OCC2CO2)cc1)c1ccc(OCC2CO2)cc1]

Content of the diglycidyl compound is 5 wt % or more, preferably 20 wt % or more based on the weight of the composition. The contents of the diglycidyl compound is 95 wt % or less, preferably 50 wt % or less based on the weight of the composition.

(b) Hardener

The hardener used for the composition of this invention can be selected any known hardeners. Preferably, the hardener has at least one amino group. Examples of the hardener include 1,6-hexanediamine, N,N'-dimethyl-1,2-cyclohexanediamine, diethylenetriamine, sulfanilamide (SAA), 4,4'-methylenedianiline (diaminodiphenylmethane, DDM), 4,4'-diaminodiphenylsulfone (DDS), 1,4-phenylenediamine (PDA), biphenyl amine, 1,4-diaminobenzene ethylene-glycol di(aminopropyl) ether, diethylene glycol di(aminopropyl) ether, 4,4'-diaminobiphenyl, 2,6-diaminopyridine, m-phenylenediamine, 4,4'-diaminodiphenylether, 4,4'-diamino-3,3'-dimethoxybiphenyl, 2,5-diaminonaphthalene, 4,4'-diamino-α-methylstilben and 4,4'-diaminophenylbenzoate.

The amount of the hardener is determined from the number of reactive groups within the molecule of the hardener. When a hardener has two reactive groups within the molecule, the preferable mole ratio of epoxy group from the diglycidyl compound with the amino group from hardener is normally from 1:0.1 to 1:1.5, preferably from 1:0.2 to 1:0.8, more preferably from 1:0.4 to 1:0.6.

Preferably, the hardener used for the invention has at least two amino groups. More amino groups in a hardener will decrease the hardener content and thus increase the mesogen content, which will also improve thermal conductivity.

Preferably, the hardener used for the invention is an aromatic amine. Comparing to an aliphatic amine hardener, aromatic amine hardener will decrease the reaction rate of diglycidyl compound with hardener, so that gel time of the epoxy compound will be longer. Preferably, the aromatic amine is aromatic diamine or a polyamine such as sulfanilamide, 4,4'-methylenedianiline or 4,4'-diaminodiphenylsulfone.

Preferably, the molecular weight of the amine is 200 or less. Lower molecular weight contributes less content (wt %) of the amine in the composition disclosed below.

The content of the hardener is 1 wt % or more, preferably 2 wt % or more based on the weight of the composition. The contents of the hardener is 60 wt % or less, more preferably 30 wt % or less based on the weight of the composition. Having less hardener increases the thermal conductivity of the obtained cured thermoset. Without being bound by theory, but it is believed that adding hardener into the diglycidyl compound having mesogenic structure in the composition tends to inhibit or destroy the formation of liquid crystal for the diglycidyl compound.

(c) Inorganic Filler

The composition used in the invention comprises an inorganic filler having a thermal conductivity of 100 W/m·K or more. The inorganic filler increases the thermal conductivity of the cured thermoset. Examples of such inorganic filler comprise boron nitride (BN), silica nitride ($Si_3N_4$) and aluminium nitride (AlN). Preferably, inorganic filler is boron nitride.

The particle size of the inorganic filler is preferably 30 micro meter or more, more preferably 100 micro meter or more. Further preferably, the particle size of the inorganic filler is 200 micro meter or more, and the most preferably 300 micro meter or more. Larger particle size of an inorganic filler increases thermal conductivity of the cured thermoset comprising the inorganic filler. The particle size of the inorganic filler is preferably 400 micro meter or less. Particle size means median size (D50). When assessing particle size of inorganic fillers, aggromerated size is assessed as the particle size if the inorganic fillers are aggromerated.

In addition to the size of filler, some properties of inorganic filler affect the thermal conductivity of the cured thermoset comprising the filler. Examples of properties of inorganic filler are tap density and specific surface area. Tap density is a kind of apparent density for powder, measured according to GB/T5162-2006/ISO 3953: 1993. When the sizes of two inorganic fillers are similar, the inorganic filler having smaller tap density and bigger specific surface area increases the thermal conductivity of a cured thermoset comprising the filler.

The inorganic filler may be used as a mixture. For example, a mixture of boron nitride and aluminum oxide can be used as inorganic filler of this invention.

The content of the inorganic filler is preferably 20 vol % or more, more preferably 30 vol % or more, the most preferably 50 vol % or more based on the volume of the composition. The content of the inorganic filler is 95 vol % or less, preferably 80 vol % or less based on the volume of the composition. It means, the content of the inorganic filler is preferably 30 wt % or more, more preferably 40 wt % or more, the most preferably 60 wt % or more based on the weight of the composition. The content of the inorganic filler is 99 wt % or less, preferably 95 wt % or less based on the weight of the composition.

The composition used in the invention can comprise other additives such as epoxy resins, catalyst, accelerator, flame retardant, antioxidant, solvent, coupling agent, mold release agent, pigment and dye.

Examples of other epoxy resins used for the composition of the invention include bisphenol-A-diglycidylether, bisphenol-F-diglycidylether, bisphenol-S-diglycidylether, 4,4'-biphenol diglycidyl ether and 3,3',5,5'-tetramethyl-4,4'-biphenol diglycidyl ether.

Examples of catalyst or accelerator which can be used for the composition include quaternary ammonium salts such as tetramethyl ammonium chloride, tetramethylammonium bromide and trimethyl benzylammonium chloride; alkali metal salts such as sodium hydroxide, potassium hydroxide, potassium carbonate and cesium carbonate; imidazoles such as a-methylimidazole, 2-ethyl imidazole, 2-phenyl imidazole and 2-ethyl-4-methylimidazole; organic phosphine such as 2-(dimethyl aminomethyl) phenol, a triethylenediamine, a triethanolamine, a triphenylphosphine, diphenylphosphine and a tributyl phosphine; metallic compounds such as octylic acid tin.

Examples of flame retardant used for the composition include antimony oxides, halocarbon, halogenated ester, halogenated ether, brominated flame retardant agent, and halogen free compounds such as organophosphorus compounds, organonitrogen compounds, intumescent flame retardants.

Examples of antioxidant used for the composition include sodium sulfite, sodium pyrosulfite, sodium hydrogen sulfite, sodium thiosulfate and dibutyl phenol.

Examples of solvent used for the composition include alcohol such as methanol, ethanol, ethanol and propanol; polar solvents and ether such as dimethylsulfoxide, N,N'-dimethylformamide, N,N'-dimethylacetamide, N-methyl pyrrolidone, tetrahydrofuran and diglyme; organic solvent of ester such as ethyl acetate, butyl acetate butyl lactate and butyrolactone; ketone system organic solvents such as methyl isobutyl ketone, methyl ethyl ketone, methyl isobutyl ketone, cyclohexanone and cyclohexanone; aromatic organic solvents such as toluene and xylene.

Examples of coupling agent used for the composition include chrome complex, silane coupling agent, titanate coupling agent, zirconium coupling agent, magnesium coupling agent and tin coupling agent.

Examples of mold release agent used for the composition include inorganic mold release agent such as talcum powder, mica powder, argil and clay; organic mold release agent such as aliphatic acid soap, fatty acid, paraffin, glycerol and vaseline; polymer mold release agent such as silicone oil, polyethylene glycol and polyethylene.

Examples of pigment or dye used for the composition of the invention include chromate, sulfate, silicate, borate, molybdate, phosphate, vanadate, cyanate, sulfide, azo pigment, phthalocyanine pigment, anthraquinone, indigo, quinacridone and dioxazinedyes.

<Cured Thermoset>

The cured thermoset of the invention can be formed from the composition disclosed above. The method comprises the steps of melting a mixture of (a) a diglycidyl compound having mesogenic structure and (b) a hardener; mixing (c) an inorganic filler with the mixture; pouring or injecting the mixture in a mold and curing the mixture at 80 to 180° C. for 0.5 to 10 hours. The curing step may have two steps. Preferably, the mixture is cured at 80 to 130° C., then post-cured at 140 to 180° C.

The temperature of curing the mixture affects properties of the cured thermoset. When the composition is cured at 80 to 180° C., the obtained thermoset shows liquid crystalline phase. It is considered that at the temperature interval of 80 to 130° C., the liquid crystalline structure of diglycidyl compound is maintained during curing process; at the temperature interval of 140 to 180° C., although the diglycidyl compound itself does not exhibit liquid crystalline structure, the reaction product of diglycidyl compound and hardener could still develop liquid crystalline structure.

The cured thermoset has high thermal conductivity because of its liquid crystalline phase. In addition, since the thermoset comprises inorganic filler having high thermal conductivity such as boron nitride, its thermal conductivity is much higher comparing with the thermal conductivity of a conventional thermoset. The thermal conductivity of the cured thermoset is 5 W/m·K or more, preferably 8 W/m·K or more. More preferably, the thermal conductivity of the cured thermoset is 10 W/m·K or more. The further more preferably, the thermal conductivity of the cured thermoset is 12 W/m·K or more and the most preferably the thermal conductivity of the cured thermoset is 13 W/m·K or more.

<Article>

The article of this invention comprises a heat source and a thermal management component located in proximity to the heat source. The thermal management component comprises a cured thermoset formed from the composition described above. Since the cured thermoset used in the invention has high thermal conductivity, the heat generated by the heat source is adequately transferred and removed from the heat source. The thermal management component can be an electrically insulating thermal management component.

Examples of such heat source comprise integrated circuit (IC) chip, light-emitting diode (LED), power electronics, displays and photovoltaics.

The thermal management component of the invention could be a heat sink or connecting material with heat source and heat sink. As disclosed above, heat sink is used to cool electronics components or semiconductor components such as high-power semiconductor devices, and optoelectronic devices such as higher-power lasers and light emitting diodes (LEDs). Since the cured resin of our invention has high thermal conductivity, the heat generated by the heat source is effectively transferred and removed from the heat source.

Other examples of the thermal management components are, electronic packaging agent, sealing agent, adhesive agent, electric switch, printed circuit board and wire coating.

The article of the invention could be a substrate with electronics element or semiconductor element such as IC chips or power electronics (heat source) and plastic substrate or plastic film contacted to such heat source (a thermal management component). IC chips or other electronics elements are normally mounted on a laminated plastic substrate such as epoxy or polyimide resin. Ceramic substrate such as aluminum or aluminum nitrate is also used as a substrate for power electronics because of the need for heat management generated by the power electronics. Since ceramic substrate is difficult to laminate or process, plastic substrate with high thermal conductivity is desired. The cured resin of our invention can be used for the purpose.

The article of the invention could be a system comprising electronics device (heat source) and a covering thermoset resin of the device (a thermal management component). To protect electronics devices from mechanical damages, electronics devices are covered by a material such as thermoset resin. Since electronics devices generate heat, thermal management of the material is required. The cured resin of our invention with high thermal conductivity can be used for the purpose. Example of such article is LED lightning system with LED light encapsulated by the cured thermoset.

The article of the invention could be a solid state lightening system comprising LED light (heat source) and a base which is mounted the LED light (a thermal management component). In solid state lightning system, LED light is mounted on a base and surrounded by a side-wall. Since the LED light generates heat, thermal management of the solid state lightning system is required. The cured resin of our invention with high thermal conductivity can be used for the purpose.

EXAMPLES

Example 1 (Comparative Example)

A diglycidyl compound (diglycidyl ether of 4,4'-dihydroxy-alpha-methylstilbene (e-DHAMS), available from Dow Chemical) designated to the following chemical formula is used.

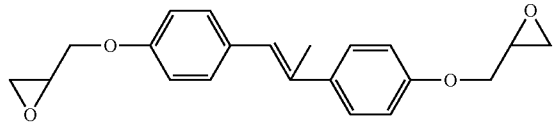 [SMILES: C/C(=C\c1ccc(OCC2CO2)cc1)c1ccc(OCC2CO2)cc1]

1 g of e-DHAMS and 0.24 g of sulfanilamide (SAA) were mixed and heated to 170° C. After the mixture was fully melted, 0.36 g of aluminum oxide ($Al_2O_3$) filler (particle size was 5-10 microns, provided by Zhengzhou Zhongtian Special Alumina Co., Ltd) wad added. The volume % of aluminum oxide was 8 vol % based on the volume of the mixture. (The content of $Al_2O_3$ was 22 wt % based on the weight of the mixture.) The whole mixture was stirred uniformly, then poured into a circular mold with diameter of 3 cm. The poured mixture was cured at 120° C. for 3 hours, then post-cured at 150° C. for 2 hours. The thickness of the cured sample was 0.2 cm. The thermal conductivity test was conducted.

Analysis

Thermal conductivity of the cured sample was measured by a thermal analysis meter (DRL-II, Xiangtan Xiangyi Instrument Co., Ltd). The temperature of thermal conductive analysis was 60° C.

Examples 2-5 (Comparative Examples)

Same procedure as of Example 1 was conducted excepting for the content of $Al_2O_3$ filler were changed as shown in Table 1.

Example 6 (Comparative Example)

Same procedure as of Example 1 was conducted excepting for $Al_2O_3$ filler was not added.

Examples 7-12 (Comparative Examples)

Same procedure as Example 1 was conducted excepting for a dyglycidyl compound which does not have mesogenic structure (Epoxy D.E.R.331™, available from Dow Chemical,) designated by the following chemical formula was used instead of e-DHAMS, and the contents of $Al_2O_3$ filler were changed as shown in Table 1.

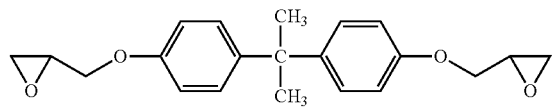

TABLE 1

| Examples | Diglycidyl compound | Hardener | $Al_2O_3$ (vol. %) | K (W/m · K) |
|---|---|---|---|---|
| 1 | e-DHAMS | SAA | 8 | 0.42 |
| 2 | e-DHAMS | SAA | 15 | 0.53 |
| 3 | e-DHAMS | SAA | 21 | 0.75 |
| 4 | e-DHAMS | SAA | 26 | 1.1 |
| 5 | e-DHAMS | SAA | 31 | 1.5 |
| 6 | e-DHAMS | SAA | 0 | 0.35 |
| 7 | D.E.R.331 | SAA | 0 | 0.26 |
| 8 | D.E.R.331 | SAA | 8 | 0.31 |
| 9 | D.E.R.331 | SAA | 15 | 0.37 |
| 10 | D.E.R.331 | SAA | 21 | 0.46 |
| 11 | D.E.R.331 | SAA | 26 | 0.61 |
| 12 | D.E.R.331 | SAA | 31 | 0.88 |

Example 13 (Inventive Example)

5 g of e-DHAMS and 1.2 g of sulfanilamide (SAA) were mixed and heated to 170° C. After the mixture was fully melted, 10 g of boron nitride (BN) filler (PT670, D50 of the agglomerated particles is 325 micro meters, tap density is 1 g/cm³, specific surface area is 1.1 m²/g, provided by Momentive) was added. The volume % of boron nitride was 50 based on the whole volume of the mixture. (The content of BN was 65 wt % based on the weight of the composition.) The mixture was stirred uniformly, then poured into a circular mold with diameter of 3 cm. The poured mixture was put into a hot-press and compressed at 130° C., then the pressed sample was cured at 100° C. for 3 hours, 120° C. for 2 hours and post-cured at 150° C. for 2 hours. The sample was cut into square pieces with length of 1 cm and thickness of 0.2 cm. The thermal conductivity test was conducted.

Example 14 (Inventive Example)

Same procedure as of Example 13 was conducted excepting for 12.6 g of BN filler was added. The volume % of BN was 56 based on the whole volume of the mixture.

Example 15 (Comparative Example)

Same procedure as of Example 13 was conducted excepting for BN filler was not added.

Examples 16-18 (Comparative Examples)

Benzoxazine shown in the following chemical structure was used instead of dyglycidyl compound of the invention.

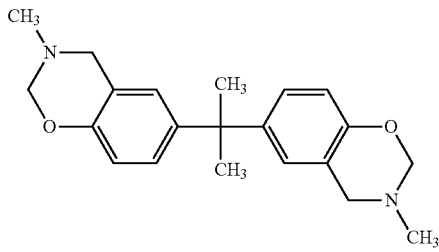 [SMILES: CN1COc2ccc(C(C)(C)c3ccc4c(c3)CN(C)CO4)cc2C1]

Polybenzoxazine is a kind of thermosetting resin without mesogenic structure and is the same resin disclosed in U.S. Pat. No. 5,900,447. It was prepared according to Journal of Polymer science: Part A Polymer Chemistry, 1994, Vol. 32, 1121-1129. 5 g of benzoxazine was melted at 100° C. and then the amount shown in Table 2 of BN filler was added into the melted benzoxazine. The whole mixture was stirred uniformly and then poured into a square mold with length of 3 cm. Subsequently, the mold was put into a hot-press and compressed at 100° C. for a flat sample. Finally, the composite was cured at 180° C. for 3 hours. This flat sample was further cut into square pieces with length of 1 cm and thickness of 0.2 cm for thermal conductivity measurement.

TABLE 2

| Examples | Monomer | Hardener | BN (vol. %(wt %)) | K (W/m · K) |
|---|---|---|---|---|
| 13 | e-DHAMS | SAA | 50 (65) | 5.6 |
| 14 | e-DHAMS | SAA | 56 (70) | 12.2 |
| 15 | e-DHAMS | SAA | 0 | 0.36 |
| 16 | Polybenzoxazine | — | 0 | 0.18 |
| 17 | Polybenzoxazine | — | 46 (61) | 1.2 |
| 18 | Polybenzoxazine | — | 57 (71) | 5.4 |

Examples 19 (Inventive Example)

Same procedure as of Example 13 was conducted excepting for boron nitride (BN) filler (CTS2M, D50 of agglomerated filler is 35 micro meter, tap density is 0.3 g/cm$^3$, specific surface area is 3.5 m$^2$/g, provided by Saint-Gobain) was used instead of the BN filler of the Example 13. The volume % of BN filler was 50 based on the volume of the composition.

Examples 20 (Inventive Example)

Same procedure as of Example 13 was conducted excepting for boron nitride (BN) filler (CTS7M, D50 of agglomerated filler is 120 micro meter, tap density is 0.5 g/cm$^3$, specific surface area is 3.5 m$^2$/g, provided by Saint-Gobain) was used instead of the BN filler of the Example 13. The volume % of BN filler was 50 based on the volume of the composition.

Examples 21 (Inventive Example)

Same procedure as of Example 13 was conducted excepting for boron nitride (BN) filler (CTS25M, D50 of agglomerated filler is 300 micro meter, tap density is 0.4 g/cm$^3$, specific surface area is 3.5 m$^2$/g, provided by Saint-Gobain) was used instead of the BN filler of the Example 13. The volume % of BN filler was 50 based on the volume of the composition.

Examples 22 and 23 (Inventive Examples)

Same procedure as of Example 21 was conducted excepting for the contents of the BN filler were changed to 30 vol % and 40 vol % respectively.

TABLE 3

| Examples | Particle size (D50) (micro meter) | Filler content (vol %(wt %)) | Thermal conductivity (W/m · K) |
|---|---|---|---|
| 19 | 35 | 50 (65) | 6.0 |
| 20 | 120 | 50 (65) | 7.5 |
| 21 | 300 | 50 (65) | 14.8 |
| 22 | 300 | 30 (45) | 8.8 |
| 23 | 300 | 40 (56) | 12.8 |

Examples 24 (Inventive Example)

Same procedure as of Example 13 was conducted excepting for boron nitride (BN) filler (CTS25M) was used instead of the BN filler of the Example 13. The volume % of BN was 56 based on the volume of the composition.

Examples 25 (Inventive Example)

Same procedure as of Example 13 was conducted excepting for a mixture of boron nitride (BN) filler (CTS25M) and aluminum oxide (Al$_2$O$_3$) filler (AX10-75, D50 is 10 micro meter, provided by Nippon steel) was used instead of the BN of the Example 13. The volume % of BN and Al$_2$O$_3$ were 42 and 14 respectively based on the volume of the composition.

Examples 26 (Inventive Example)

Same procedure as of Example 25 was conducted excepting for boron nitride (BN) filler (PT670) was used instead of Al$_2$O$_3$ filler of the Example 25. The volume % of BN fillers (CTS25M and PT670) were 42 and 14 respectively based on the volume of the composition.

Examples 27 (Inventive Example)

Same procedure as of Example 25 was conducted excepting for boron nitride (BN) filler (CTS7M) was used instead of Al$_2$O$_3$ of the Example 25. The volume % of BN fillers (CTS25M and CTS25M) were 25 and 25 respectively based on the volume of the composition.

TABLE 4

| | Filler 1 | | Filler 2 | | Thermal conductivity (W/m · K) |
|---|---|---|---|---|---|
| Examples | Filler (D50) (micrometer) | Content (vol % (wt %)) | Filler (D50) (micrometer) | Content (vol % (wt %)) | |
| 24 | BN(300) | 56 (70) | — | — | 14.53 |
| 25 | BN(300) | 42 (58) | Al$_2$O$_3$(10) | 14 (35) | 10.76 |

TABLE 4-continued

| Examples | Filler 1 Filler (D50) (micrometer) | Filler 1 Content (vol %) (wt %)) | Filler 2 Filler (D50) (micrometer) | Filler 2 Content (vol %) (wt %)) | Thermal conductivity (W/m · K) |
|---|---|---|---|---|---|
| 26 | BN(300) | 42 (58) | BN(325) | 14 (24) | 13.68 |
| 27 | BN(300) | 25 (39) | BN(120) | 25 (39) | 8.98 |

Examples 28-32 (References)

Those Examples are the tests for the effect of hardener. The hardeners shown in Table 5 were used for each example. The same procedure as of Example 15 was conducted excepting for the hardener shown in table 3 were used instead of SAA.

TABLE 5

| Examples | Hardener | Molecular weight (g/mol) | Reaction mole ratio with e-DHAMS | Content in whole composition (wt %) | Thermal conductivity (W/m · K) |
|---|---|---|---|---|---|
| 28 | THPA | 152 | 2:1 | 47.4 | 0.25 |
| 29 | DDS | 248 | 1:2 | 26.8 | 0.32 |
| 30 | DDM | 198 | 1:2 | 22.7 | 0.34 |
| 31 | SAA | 172 | 1:2 | 20.3 | 0.36 |
| 32 | PDA | 108 | 1:2 | 13.8 | 0.39 |

Chemical name and chemical structure of hardener used in Examples 28-32

THPA: (tetrahydrophthalic anhydride)

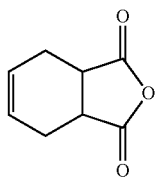

DDS: (4,4'-diamino diphenyl sulfone)

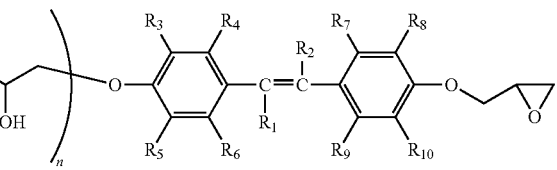

DDM: (4,4'-diaminodiphenylmethane)

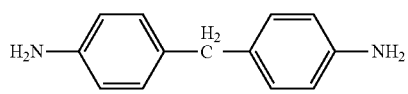 [SMILES: Nc1ccc(Cc2ccc(N)cc2)cc1]

SAA: Sulfanilamide

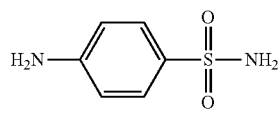

PDA: P-phenylenediamine

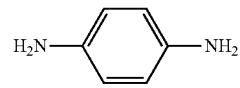

What is claimed is:

1. An article comprising a heat source and an electrically insulating thermal management component located in proximity to the heat source, wherein the thermal management component comprises a cured thermoset formed from a composition comprising:
   (a) a diglycidyl compound which has mesogenic structure, and melting point of the compound is 150 degrees Centigrade or less,
   (b) a hardener and
   (c) an inorganic filler of its thermal conductivity is 100 W/m·K or more.

2. The article of claim 1 wherein the composition may further comprise another inorganic filler, and the content of total inorganic filler is 30 volume % or more based on the volume of the composition.

3. The article of claim 1 wherein the diglycidyl compound is represented by the following formula (1);

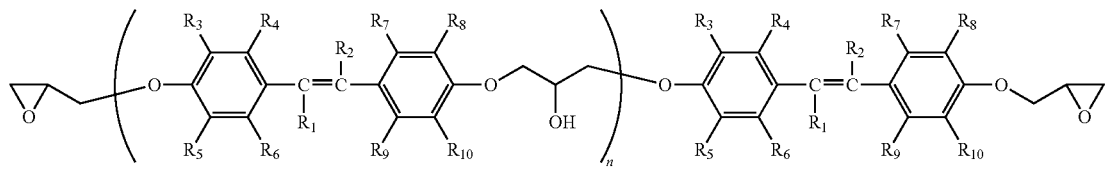

wherein $R_1$ and $R_2$ are independently selected from hydrogen atoms or an aliphatic hydrogen group having from 1 to 10 carbon atoms, $R_3$ to $R_{10}$ are independently selected from the group consisting of hydrogen atom, alkyl group having 1 to 10 carbon atoms, trifluoromethyl group, aryl group, halogen atom, nitro group, nitrile group and methoxy group, n is a integer from 0 to 10.

4. The article of claim 1, wherein the diglycidyl compound is represented by the following formula (2);

(2)

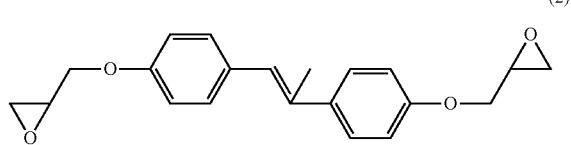

5. The article of claim 1 wherein the hardener is a diamine having at least one aromatic ring.

6. The article of claim 1 wherein the heat source is an electrical element or a semiconductor element.

7. The article of claim 1 wherein the electrical element or semiconductor element is selected from lighting elements, display elements, power elements and photovoltaic cells.

8. A cured thermoset with the thermal conductivity of 8 W/m·K or more, wherein the thermoset is formed from a composition comprising;
(a) a dyglycidyl compound of the following formula (2);

(2)

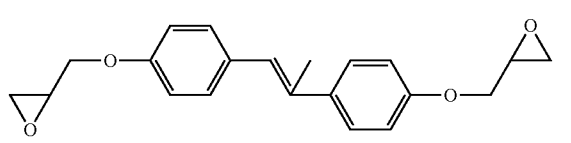

(b) a hardener and (c) an inorganic filler of its thermal conductivity is 100 W/m·K or more, the composition may comprise further another inorganic filler, and the total filler content is 30 volume % or more based on the volume of the composition.

9. The cured thermoset of claim 8, wherein the inorganic filler is boron nitride and the particle size of the boron nitride is 30 micro meter or more.

10. The cured thermoset of claim 9, wherein the thermal conductivity of the thermoset is 10 W/m·K or more, the boron nitride is agglomerated and the size of the agglomerated boron nitride is 200 micro meter or more.

11. A method for forming the cured thermoset of claim 8, wherein the cured temperature of the composition is from 80 to 180 degrees Centigrade.

* * * * *